United States Patent
Singh et al.

(10) Patent No.: US 9,397,646 B2
(45) Date of Patent: Jul. 19, 2016

(54) DELAY CIRCUIT

(71) Applicant: QUALCOMM Incorporated, San Diego, CA (US)

(72) Inventors: Guneet Singh, San Diego, CA (US); Yuehchun Claire Cheng, San Diego, CA (US); Jan Christian Diffenderfer, Escondido, CA (US); Vaishnav Srinivas, San Diego, CA (US); Robert Won Chol Kim, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 87 days.

(21) Appl. No.: 14/489,055

(22) Filed: Sep. 17, 2014

(65) Prior Publication Data

US 2016/0079971 A1    Mar. 17, 2016

(51) Int. Cl.
| | |
|---|---|
| *H03K 5/13* | (2014.01) |
| *G11C 7/10* | (2006.01) |
| *G11C 7/22* | (2006.01) |
| *G11C 11/4076* | (2006.01) |
| *G11C 29/02* | (2006.01) |
| *H03K 5/00* | (2006.01) |

(52) U.S. Cl.
CPC ............ *H03K 5/13* (2013.01); *G11C 7/1066* (2013.01); *G11C 7/1093* (2013.01); *G11C 7/222* (2013.01); *G11C 11/4076* (2013.01); *G11C 29/023* (2013.01); *G11C 29/028* (2013.01); *H03K 2005/00019* (2013.01)

(58) Field of Classification Search
CPC ..................................................... H03K 5/13
USPC ........................................................ 327/276
See application file for complete search history.

(56) References Cited

U.S. PATENT DOCUMENTS

| | | | | |
|---|---|---|---|---|
| 6,049,239 A | * | 4/2000 | Eto ........................... | G06F 1/10 327/12 |
| 6,137,334 A | * | 10/2000 | Miller, Jr. .............. | H03K 5/135 327/149 |
| 6,208,212 B1 | | 3/2001 | White | |
| 6,255,879 B1 | * | 7/2001 | Voss ....................... | H03K 5/131 327/271 |
| 6,414,530 B2 | | 7/2002 | Noda et al. | |
| 6,518,812 B1 | * | 2/2003 | Sikkink ................ | H03H 11/265 327/277 |
| 6,707,496 B1 | * | 3/2004 | Yang ....................... | G11C 27/04 348/303 |

(Continued)

OTHER PUBLICATIONS

Joshi, Sopan et al., "A 12-Gb/s transceiver in 32-nm bulk CMOS," Symposium on VLSI Circuits Digest of Technical Papers, 2009, pp. 52-53.

(Continued)

*Primary Examiner* — Ryan Jager
(74) *Attorney, Agent, or Firm* — Loza & Loza LLP

(57) ABSTRACT

Systems and methods for delay control are described herein. In one embodiment, a delay circuit comprises a first delay path and a second delay path. The delay circuit also comprises a plurality of switches, wherein each switch is coupled between different points on the first and second delay paths, and each switch is configured to turn on or off in response to a respective one of a plurality of select signals. The delay circuit further comprises a multiplexer having a first input coupled to an output of the first delay path, a second input coupled to an output of the second delay path, and an output coupled to an output of the delay circuit, wherein the multiplexer is configured to selectively couple one of the outputs of the first and second delay paths to the output of the delay circuit in response to a second select signal.

28 Claims, 6 Drawing Sheets

(56) References Cited

U.S. PATENT DOCUMENTS

| | | | |
|---|---|---|---|
| 6,836,166 B2 | 12/2004 | Lin et al. | |
| 7,236,411 B1 | 6/2007 | Saini et al. | |
| 7,492,185 B1 * | 2/2009 | Huang | H03K 19/17744 326/38 |
| 7,626,435 B2 | 12/2009 | Haugestuen | |
| 7,710,171 B2 * | 5/2010 | Kim | H03L 7/07 327/149 |
| 7,902,897 B2 * | 3/2011 | Hashimoto | H03K 5/131 327/262 |
| 2008/0252513 A1 * | 10/2008 | Inoue | G01S 7/4004 342/175 |
| 2009/0160520 A1 * | 6/2009 | Matsunami | H03K 7/08 327/276 |
| 2010/0244921 A1 | 9/2010 | Barbier | |
| 2013/0342251 A1 * | 12/2013 | Patel | H03L 7/08 327/158 |
| 2014/0112045 A1 | 4/2014 | Arsovski et al. | |

OTHER PUBLICATIONS

International Search Report and Written Opinion—PCT/US2015/041587—ISA/EPO—Nov. 26, 2015.

* cited by examiner

| Delay Setting | Switches Turn On | Selected Delay Path |
|---|---|---|
| 0 | None | Fast |
| 1 | 1 | Fast |
| 2 | 1 and 2 | Fast |
| 3 | 1, 2 and 3 | Fast |
| 4 | 1, 2, 3 and 4 | Fast |
| 5 | 1, 2, 3, 4 and 5 | Fast |
| 6 | 1, 2, 3, 4, 5 and 6 | Fast or Slow |
| 7 | 1, 2, 3, 4 and 5 | Slow |
| 8 | 1, 2, 3 and 4 | Slow |
| 9 | 1, 2 and 3 | Slow |
| 10 | 1 and 2 | Slow |
| 11 | 1 | Slow |
| 12 | None | Slow |

DELAY CIRCUIT

BACKGROUND

1. Field

Aspects of the present disclosure relate generally to delay, and more particularly, to delay circuits.

2. Background

A chip may include a memory interface for interfacing circuits (e.g., a memory controller) on the chip with an external memory device, such as a double data rate dynamic random access memory (DDR DRAM). The memory interface may include delay circuits for adjusting the timing of signals (e.g., data signals) in the memory interface. For example, the memory interface may include delay circuits to compensate for skew between data signals (e.g., due to mismatches in the lengths of data lines between the memory interface and the external memory device). In another example, the memory interface may include a delay circuit to center a data strobe signal used for data sampling between transitions of the data signals.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a delay circuit is described herein. The delay circuit comprises a first delay path having an input coupled to an input of the delay circuit, and an output, and a second delay path having an input coupled to the input of the delay circuit, and an output. The delay circuit also comprises a plurality of switches, wherein each switch is coupled between different points on the first and second delay paths, and each switch is configured to turn on or off in response to a respective one of a plurality of select signals. The delay circuit further comprises a multiplexer having a first input coupled to the output of the first delay path, a second input coupled to the output of the second delay path, and an output coupled to an output of the delay circuit, wherein the multiplexer is configured to selectively couple one of the outputs of the first and second delay paths to the output of the delay circuit in response to a second select signal.

A second aspect relates to a method for controlling delay of a delay circuit. The delay circuit comprises first and second delay paths and a plurality of switches, wherein each of the plurality of switches is coupled between different points on the first and second delay paths. The method comprises inputting a signal to be delayed to an input of the first delay path and an input of the second delay path, selectively turning each switch on or off according to a desired one of a plurality of delay settings, and selecting an output of the first delay path or an output of the second delay path according to the desired one of the plurality of delay settings.

A third aspect relates to an apparatus for controlling delay of a delay circuit. The delay circuit comprising first and second delay paths and a plurality of switches, wherein each of the plurality of switches is coupled between different points on the first and second delay paths. The apparatus comprises means for inputting a signal to be delayed to an input of the first delay path and an input of the second delay path, means for selectively turning each switch on or off according to a desired one of a plurality of delay settings, and means for selecting an output of the first delay path or an output of the second delay path according to the desired one of the plurality of delay settings.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A chip may include a memory interface for interfacing circuits (e.g., a memory controller) on the chip with an external memory device, such as a double data rate dynamic random access memory (DDR DRAM). The memory interface may include delay circuits for adjusting the timing of signals (e.g., data signals) in the memory interface. For example, the memory interface may include delay circuits to compensate for skew between data signals (e.g., due to mismatches in the lengths of data lines between the memory interface and the external memory device). In another example, the memory interface may include a delay circuit to center a data strobe signal used for data sampling between transitions of the data signals.

As the data rate of the data signals increases (e.g., exceeds 3-Gb/s/pin), more precise delay is needed in order to meet tight timing requirements at high data rates. Imprecise delay can cause errors in the received data and reduce the maximum data rate of the memory interface. Accordingly, a delay circuit with fine delay is needed.

Figure 1:
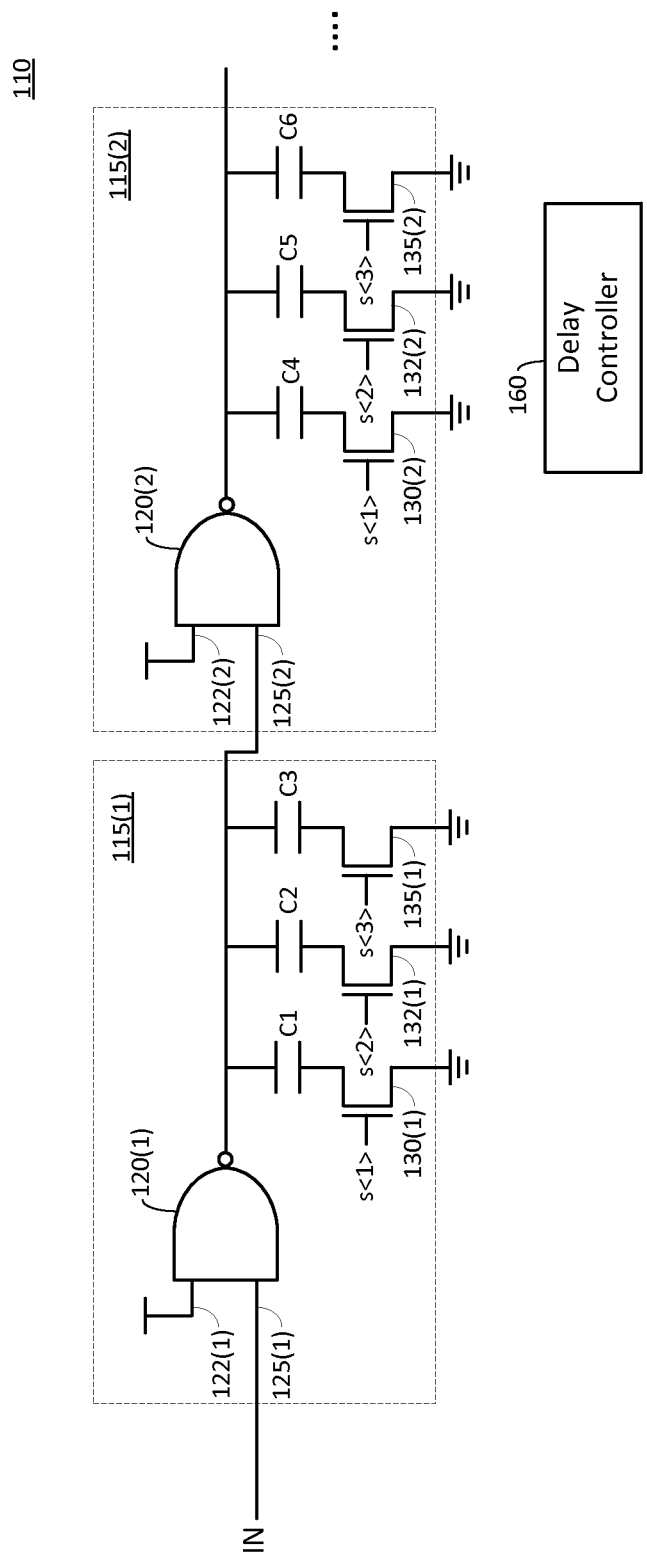
FIG. 1 shows an example of a fine delay circuit with tunable capacitive loads.

FIG. 1 shows an example of a fine delay circuit 110 having a switched-capacitor structure. The delay circuit 110 comprises a plurality of delay stages coupled in series, in which the signal being delayed propagates through the delay stages. For ease of illustration, only the first two delay stages 115(1) and 115(2) are shown in FIG. 1. The first delay stage 115(1) comprises a first NAND gate 120(1), first, second and third capacitors C1, C2 and C3, and first, second and third switches 130(1), 132(1) and 135(1). The second delay stage 115(2) comprises a second NAND gate 120(2), fourth, fifth and sixth capacitors C4, C5 and C6, and fourth, fifth and sixth switches 130(2), 132(3) and 135(2). The fine delay circuit 110 may also comprise a delay controller 160 for controlling the delay of the delay circuit 110, as discussed further below.

The first NAND gate 120(1) in the first delay stage 115(1) has a first input 122(1) coupled to a supply voltage (logic one), and a second input 125(1) coupled to an input of the delay circuit 110 (denoted "IN"). The second NAND gate 120(2) in the second delay stage 115(2) has a first input 122(2) coupled to the supply voltage (logic one), and a second input 125(2) coupled to the output of the first NAND gate 120(1) in the first delay stage 115(1). The output of the second NAND gate 120(2) in the second delay stage 115(2) is coupled to an input of a third NAND gate in a third delay stage (not shown). Since the first inputs 122(1) and 122(2) of the NAND gates 120(1) and 120(2) are coupled to the supply voltage (logic one), the NAND gates function as inverters in this example.

In the first delay stage 115(1), the first, second and third capacitors C1, C2 and C3 are coupled to the output of the first NAND gate 120(1). The first switch 130(1) is configured to selectively couple the first capacitor C1 to ground according to a first select signal (denoted "s<1>"), the second switch 132(1) is configured to selectively couple the second capacitor C2 to ground according to a second select signal (denoted "s<2>"), and the third switch 135(1) is configured to selectively couple the third capacitor C3 to ground according to a third select signal (denoted "s<3>"). In the example shown in FIG. 1, each of the switches comprises an n-type metal-oxide-semiconductor (NMOS) transistor. As a result, each switch couples the respective capacitor to ground when the respective select signal is logic one, and decouples the respective capacitor from ground when the respective select signal is logic zero.

In the second delay stage 115(2), the fourth, fifth and sixth capacitors C4, C5 and C6 are coupled to the output of the second NAND gate 120(2). The fourth switch 130(2) is configured to selectively couple the fourth capacitor C4 to ground according to the first select signal s<1>, the fifth switch 132(2) is configured to selectively couple the fifth capacitor C5 to ground according to the second select signal s<2>, and the sixth switch 135(2) is configured to selectively couple the sixth capacitor C6 to ground according to the third select signal s<3>. In the example shown in FIG. 1, each of the switches comprises an NMOS transistor. As a result, each switch couples the respective capacitor to ground when the respective select signal is logic one, and decouples the respective capacitor from ground when the respective select signal is logic zero.

In operation, the delay controller 160 tunes the delay of each delay stage 115(1) and 115(2) by tuning the capacitive load at the output of the respective NAND gate 120(1) and 120(2). The larger the capacitive load, the longer the delay. The delay controller 160 tunes the capacitive load of each delay stage by selectively turning on the switches in the delay stage using the select signals s<1>, s<2> and s<3>. More particularly, the delay controller 160 turns on a switch in a delay stage if the capacitance of the respective capacitor is to be added to the capacitive load at the output of the delay stage.

Thus, the delay controller 160 tunes the delay of the delay circuit 110 by tuning the capacitive loads at the outputs of the delay stages 115(1) and 115(2). This allows the delay controller 160 to finely tune the delay of the delay circuit 110. However, some of the nodes in the delay circuit 110 may have unknown states that can lead to timing uncertainties in the delay circuit 110. This is because, when a switch is turned off, the node between the switch and the respective capacitor is floating. As a result, the node may be left in an unknown state after a signal propagates through the delay circuit 110. When a subsequent signal propagates through the delay circuit 110, the unknown state may cause the timing of a first cycle of the signal to vary from subsequent cycles of the signal, which can result in data delay/inter-symbol interference (ISI) type errors.

Figure 2:
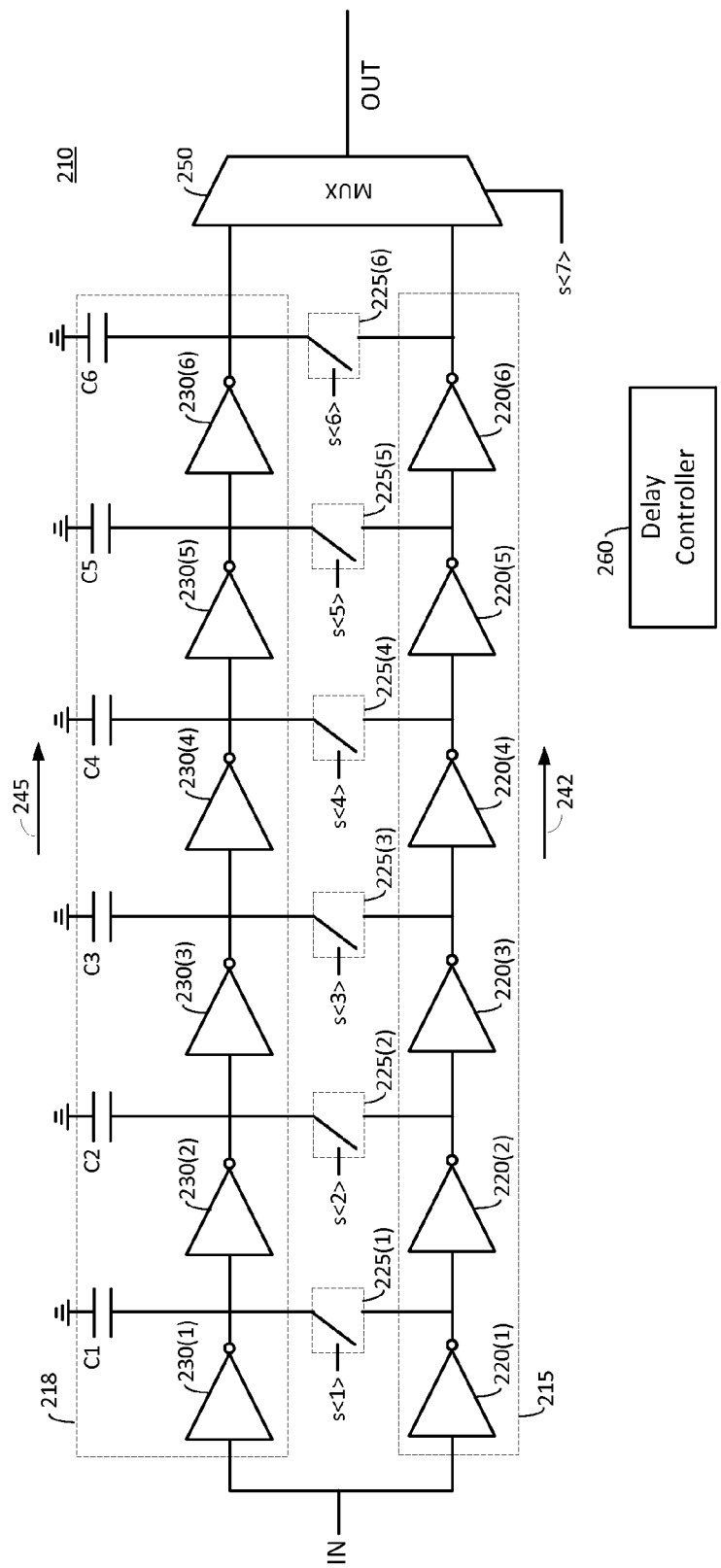
FIG. 2 shows an example of a fine delay circuit according to an embodiment of the present disclosure.

FIG. 2 shows a fine delay circuit 210 according to an embodiment of the present disclosure. The delay circuit 210 comprises a fast delay path 215, and a slow delay path 218. The fast delay path 215 comprises a first plurality of delay gates 220(1)-220(6) coupled in series, where each delay gate 220(1)-220(6) may be considered a delay stage of the fast delay path 215. The slow delay path 218 comprises a second plurality of delay gates 230(1)-230(6) coupled in series, where each delay gate 230(1)-230(6) may be considered a delay stage of the slow delay path 218. In the example show in FIG. 2, each delay gate comprises an inverter. However, it is to be appreciated that other types of delay gates may be used, and therefore that the present disclosure is not limited to inverters.

In one aspect, the delay gates 230(1)-230(6) in the slow delay path 218 may be substantially identical to the delay gates 220(1)-220(6) in the fast delay path 215. In this aspect, the delay of the slow delay path 218 is made slower than the delay of the fast delay path 215 by coupling the output of each delay gate 230(1)-230(6) in the slow delay path 218 to a respective capacitor C1 to C6, as shown in FIG. 2. The capacitors C1 to C6 increase the capacitive loads at the outputs of the delay gates 230(1)-230(6) in the slow delay path 218, thereby increasing the delay of the slow delay path 218 relative to the fast delay path 215. Each of the capacitors C1 to C6 may have approximately the same capacitance. Each of the capacitors C1 to C6 may comprise a metal-insulator-metal (MIM) capacitor, a gate capacitor, or other type of capacitor.

The inputs of both the fast delay path 215 and the slow delay path 218 are coupled to the input (denoted "IN") of the delay circuit 210. A signal at the input (IN) of the delay circuit 210 propagates down the fast delay path 215 in the direction indicated by arrow 242, and propagates down the slow delay path 218 in the direction indicated by arrow 245 in FIG. 2.

The delay circuit 210 also comprises a plurality of switches 225(1)-225(6) between the fast and slow delay paths 215 and 218. More particularly, the switches 225(1)-225(6) include a first switch 225(1) coupled between the outputs of the first delay stages (i.e., delay gates 220(1) and 230(1)) of the fast and slow delay paths 215 and 218, a second switch 225(2) coupled between the outputs of the second delay stages (i.e., delay gates 220(2) and 230(2)) of the fast and slow delay paths 215 and 218, and a third switch 225(3) coupled between the outputs of the third delay stages (i.e., delay gates 220(3) and 230(3)) of the fast and slow delay paths 215 and 218. The switches 225(1)-225(6) further include a fourth switch 225(4) coupled between the outputs of the fourth delay stages (i.e., delay gates 220(4) and 230(4)) of the fast and slow delay paths 215 and 218, a fifth switch 225(5) coupled between the outputs of the fifth delay stages (i.e., delay gates 220(5) and 230(5)) of the fast and slow delay paths 215 and 218, and a sixth switch 225(6) coupled between the outputs of the sixth delay stages (i.e., delay gates 220(6) and 230(6)) of the fast and slow delay paths 215 and 218. It is to be appreciated that the numbers of delay stages and switches shown in FIG. 2 are exemplary only, and that different numbers of delay stages and switches may be used.

Each switch 225(1)-225(6) receives a respective select signal (denoted "s<1>" to "s<6>") from the delay controller 260. For ease of illustration, the individual connections between the switches and the delay controller 260 are not shown in FIG. 2. Each switch 225(1)-225(6) is configured to selectively couple the outputs of the respective delay stages of the first and second delay paths 215 and 218 according to the respective select signal. More particularly, the first switch 225(1) is configured to selectively couple the outputs of the first delay stages according to the logic state of a first one of the select signals s<1>, the second switch 225(2) is configured to selectively couple the outputs of the second delay stages according to the logic state of a second one of the select signals s<2>, and the third switch 225(3) is configured to selectively couple the outputs of the third delay stages according to the logic state of a third one of the select signals s<3>. The fourth switch 225(4) is configured to selectively couple the outputs of the fourth delay stages according to the logic state of a fourth one of the select signals s<4>, the fifth switch 225(5) is configured to selectively couple the outputs of the fifth delay stages according to the logic state of a fifth one of the select signals s<5>, and the sixth switch 225(6) is configured to selectively couple the outputs of the sixth delay stages according to the logic state of a sixth one of the select signals s<6>. In one aspect, each switch may be configured to couple the outputs of the respective delay stages when the respective select signal is logic one, and decouple the outputs of the respective delay stages when the respective select signal is logic zero, or vice versa.

The delay circuit 210 further comprises a multiplexer 250 having two inputs and one output, in which one of the inputs of the multiplexer 250 is coupled to an output of the fast delay path 215, the other input of the multiplexer 250 is coupled to an output of the slow delay path 218, and the output of the multiplexer 250 is coupled to an output (denoted "OUT") of the delay circuit 210. The multiplexer 250 is configured to selectively couple the output of one of the fast and slow delay paths 215 and 218 to the output (OUT) of the delay circuit 210 according to the logic state of a seventh select signal (denoted "s<7>") from the delay controller 260. For example, the multiplexer 250 may be configured to select the output of the slow delay path 218 when the select signal s<7> is logic one, and select the output of the fast delay path 215 when the select signal s<7> is logic zero, or vice versa.

The delay controller 260 is configured to tune the delay of the delay circuit 210 by selecting which of the switches 225(1)-225(6) are turned on and which one of the delay paths 215 and 218 is coupled to the output (OUT) of the delay circuit 210 by the multiplexer 250. In the example shown in FIG. 2, the delay controller 260 can set the delay of the delay circuit 210 to any one of 13 different delay settings, as discussed further below. However, it is to be appreciated that embodiments of the present disclosure are not limited to this example.

Figures 3, 4:
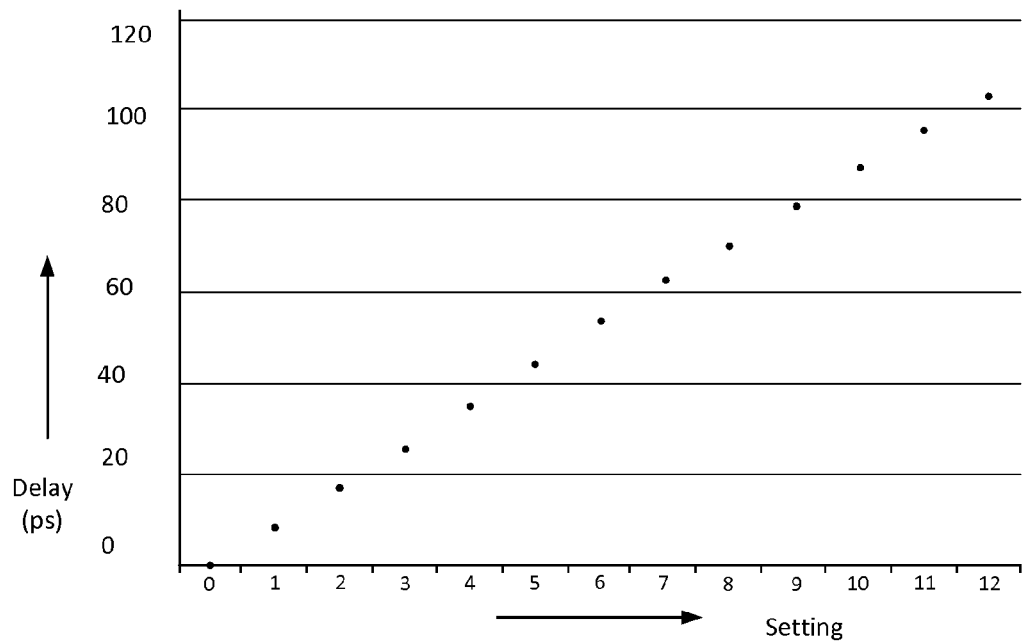
FIG. 3 is an exemplary plot showing delays for different delay settings according to an embodiment of the present disclosure.
FIG. 4 is an exemplary table showing switches that are turned on in a delay circuit for different delay settings according to embodiment of the present disclosure.

In operation, the signal being delayed may be input to both the slow delay path 215 and the fast delay path 218. The delay controller 260 may set the delay of the delay circuit 210 to one of 13 different delay settings, examples of which are shown in FIG. 3. In the example in FIG. 3, the 13 delay settings are labeled "0" to "12", in which delay setting 0 is the fastest delay setting and delay setting 12 is the slowest delay setting. FIG. 3 also shows the delay (in picoseconds) for each delay setting relative to the delay of the fastest delay setting 0.

For the fastest delay setting 0, the delay controller 260 turns off all of the switches 225(1)-225(6) and the selects the fast delay path 215 using multiplexer 250. Thus, each delay stage in the fast delay path 215 is isolated from the respective capacitor C1 to C6 in the slow delay path 218, resulting in the fastest (shortest) delay through the fast delay path 215.

For delay setting 1, the delay controller 260 turns on the first switch 225(1) with the other switches 225(2)-225(6) turned off, and selects the fast delay path 215 using multiplexer 250. By turning on the first switch 225(1), the delay controller 260 couples the output of the first delay stage (i.e., delay gate 220(1)) of the fast delay path 215 to the first capacitor C1 in the slow delay path 218. This increases the capacitive load at the output of the first delay stage of the fast delay path 215, thereby increasing the delay of the first delay stage. The delay of the first stage of the fast delay path 215 may be increased to a delay that is approximately equal to an average of the delay of the first stage of the fast delay path 215 when the first switch 225(1) is turned off and the delay of the first stage of the slow delay path 218 when the first switch 225(1) is turned off. This is because the first capacitor C1 is driven by two delay gates (i.e., delay gates 220(1) and 230(1)) when the first switch 225(1) is turned on, whereas the first capacitor C1 is only driven by one delay gate (i.e., delay gate 230(1)) when the first switch 225(1) is turned off.

For delay setting 2, the delay controller 260 turns on the first and second switches 225(1) and 225(2) with the other switches 225(3)-225(6) turned off, and selects the fast delay path 215 using multiplexer 250. This increases the delay of the second delay stage (i.e., delay gate 220(2)) of the fast delay path 215 by coupling the output of the second delay stage to the second capacitor C2 in the slow delay path 218.

For delay settings 3 to 6, the delay controller 260 progressively turns on more of the switches 225(1)-225(6) from left to right in FIG. 2 with the fast delay path selected. More particularly, the delay controller 260 turns on switches 225(1)-225(3) for delay setting 3, turns on switches 225(1)-225(4) for delay setting 4, turns on switches 225(1)-225(5) for delay setting 5, and turns on all of the switches 225(1)-225(6) for delay setting 6. Delay setting 6 results in the slowest delay (longest delay) through the fast delay path 215. This is because each delay stage in the fast delay path 215 is coupled to a respective one of the capacitors C1-C6 in the slow path 218. Thus, the delay through the fast delay path 215 progressively increases in moving from delay setting 0 to delay setting 6, an example of which is shown in FIG. 3.

At delay setting 6, the delays through the fast delay path 215 and the slow delay path 218 may be approximately the same. This is because the output of each delay stage in the fast delay path 215 is coupled to the output of the corresponding delay stage in the slow delay path 218. For delay setting 6, the delay controller 260 may select either the fast delay path 215 or the slow delay path 218 using multiplexer 250 since both paths have approximately the same delay at this setting.

For delay setting 7, the delay controller 260 turns on switches 225(1)-225(5) with the sixth switch 225(6) turned off, and selects the slow delay path 218 using multiplexer 250. By turning off the sixth switch 225(6), the delay controller 260 increases the delay of the sixth delay stage (i.e., delay gate 230(6)) of the slow delay path 218 relative to the delay of the sixth delay stage of the slow delay path 218 at delay setting 6. This is because, at delay setting 6, the sixth delay stages (i.e., delay gates 220(6) and 230(6)) of both the slow and fast delay paths 215 and 218 drive the sixth capacitor C6, whereas, at delay setting 7, only the sixth delay stage (i.e., delay gate 230(6)) of the slow delay path 218 drives the sixth capacitor C6.

For delay setting 8, the delay controller 260 turns on switches 225(1)-225(4) with switches 225(5) and 225(6) turned off, and selects the slow delay path 218 using multiplexer 250. By turning off the fifth switch 225(5), the delay controller 260 increases the delay of the fifth delay stage (i.e., delay gate 230(5)) of the slow delay path 218 relative to the delay of the fifth delay stage of the slow delay path 218 at delay setting 7. This is because, at delay setting 7, the fifth delay stages (i.e., delay gates 220(5) and 230(5)) of both the slow and fast delay paths 215 and 218 drive the fifth capacitor C5, whereas, at delay setting 8, only the fifth delay stage (i.e., delay gate 230(5)) of the slow delay path 218 drives the fifth capacitor C5.

For delay settings 9 to 12, the delay controller 260 progressively turns off more of the switches 225(1) to 225(5) from right to left in FIG. 2 with the slow path selected. More particularly, the delay controller 260 turns off switches 225(4)-225(6) for delay setting 9, turns off switches 225(3)-225(6) for delay setting 10, turns off switches 225(2)-225(6) for delay setting 11, and turns off all of the switches 225(1)-225(6) for delay setting 12. Delay setting 12 results in the slowest delay (longest delay) through the slow delay path 218. This is because, at delay setting 12, each delay stage in the slow delay path 218 has to drive the respective capacitor C1-C6 without help from the respective delay stage in the fast delay path. Thus, the delay in the slow delay path progressively increases in moving from delay setting 7 to delay setting 12, an example of which is shown in FIG. 3.

FIG. 4 is a table showing the switches that are turned on and the delay path that is selected by the delay controller 260 using multiplexer 250 for each of the delay settings discussed above.

The delay circuit 210 in FIG. 2 avoids some of the timing uncertainties associated with the delay circuit 110 in FIG. 1. This is because the nodes between the capacitors C1 to C6 and ground in the delay circuit 210 in FIG. 2 are non-floating. In contrast, in the delay circuit 110 in FIG. 1, each capacitor corresponding to a switch that is turned off has a floating node on one side. The delay circuit 210 in FIG. 2 may also be highly linear compared with a phase-interpolator based delay circuit. For instance, as shown in the example in FIG. 3, the delay of the delay circuit 210 varies approximately linearly over the delay settings.

It is to be appreciated that embodiments of the present disclosure are not limited to the example in which the capacitors C1 to C6 are coupled to ground. For example, the capacitors C1 to C6 may be coupled to a supply voltage, in which the nodes between the capacitors C1 to C6 and the supply voltage may be non-floating. It is also to be appreciated that embodiments of the present disclosure are not limited to the example of 13 delay settings shown in FIG. 2, and may have a different number of delay settings depending, for example, on the number of delay stages in each of the fast and slow delay paths.

Figure 5:
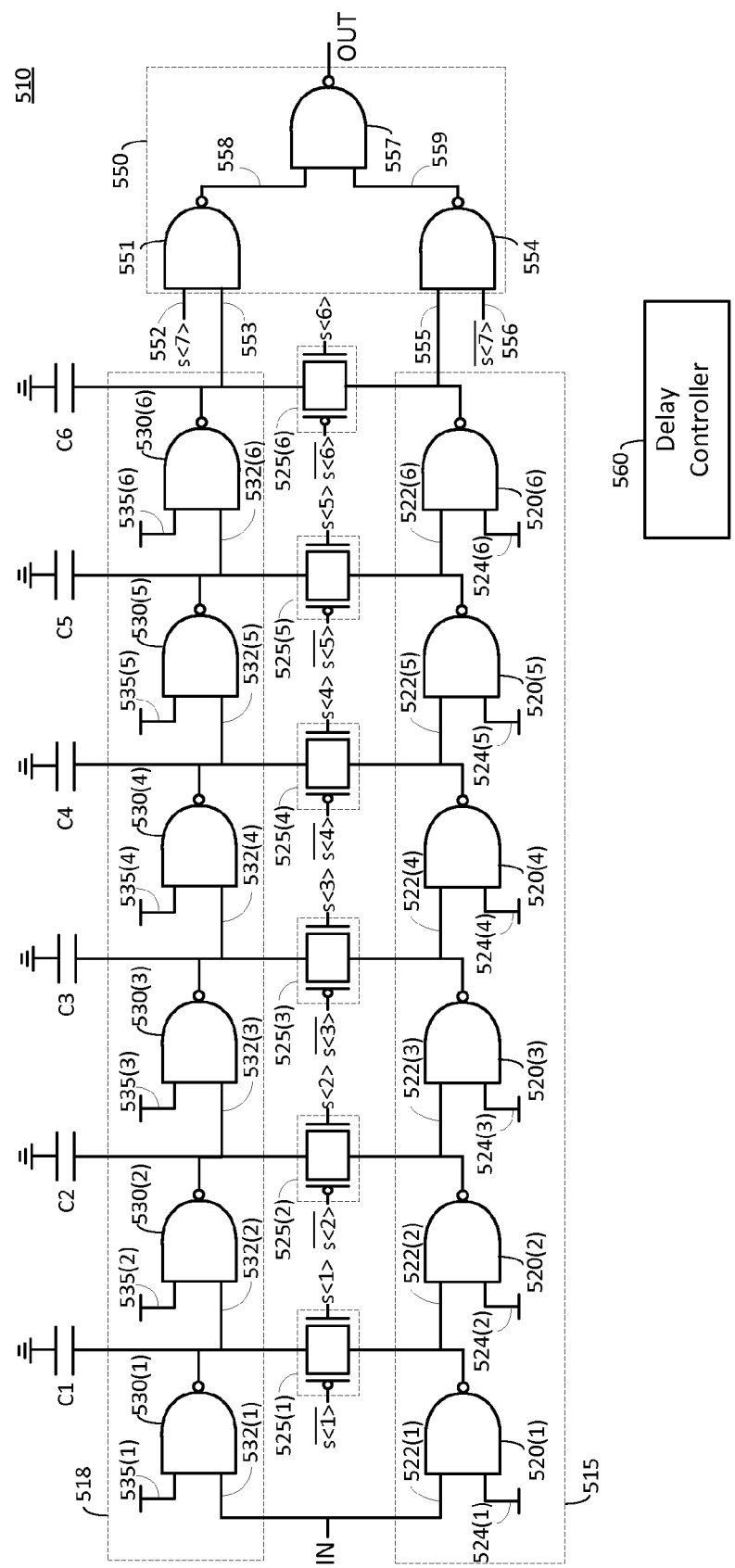
FIG. 5 shows an exemplary implementation of a fine delay circuit according to an embodiment of the present disclosure.

FIG. 5 shows an exemplary implementation of a fine delay circuit 510 according to an embodiment of the present disclosure. In this example, the delay circuit 510 comprises a fast delay path 515 and a slow delay path 518. The fast delay path 515 comprises a first plurality of NAND gates 520(1)-520(6) coupled in series, where each NAND gate 520(1)-520(6) may be considered a delay stage of the fast delay path 515. As shown in FIG. 5, each NAND gate 520(1)-520(6) has a first input 524(1)-524(6) coupled to a supply voltage (logic one) and a second input 522(1)-522(6) coupled to the respective signal path (i.e., the path of the signal being delayed). As a result, the NAND gates 520(1)-520(6) function as inverters.

The slow delay path 518 comprises a second plurality of NAND gates 530(1)-530(6) coupled in series, where each NAND gate 530(1)-530(6) may be considered a delay stage of the slow delay path 518. As shown in FIG. 5, each NAND gate 530(1)-530(6) has a first input 535(1)-535(6) coupled to the supply voltage (logic one) and a second input 532(1)-532(6) coupled to the respective signal path (i.e., the path of the signal being delayed). As a result, the NAND gates 530(1)-530(6) function as inverters. It is to be appreciated that embodiments of the present disclosure are not limited to NAND gates, and that other types of delay gates may be used including, for example, NOR gates.

In one aspect, the NAND gates 530(1)-530(6) in the slow delay path 518 may be substantially identical to the NAND gates 520(1)-520(6) in the fast delay path 515. In this aspect, the delay of the slow delay path 518 is made slower than the delay of the fast delay path 515 by coupling the output of each NAND gates 530(1)-530(6) in the slow delay path 518 to a respective capacitor C1 to C6, as shown in FIG. 5. The capacitors C1 to C6 increase the capacitive loads at the outputs of the NAND gates 530(1)-530(6) in the slow delay path 518, thereby increasing the delay of the slow delay path 518 relative to the fast delay path 515. Each of the capacitors C1 to C6 may have approximately the same capacitance. The inputs of both the fast delay path 515 and the slow delay path 518 are coupled to the input (denoted "IN") of the delay circuit 510.

The delay circuit 510 also comprises a plurality of switches 525(1)-525(6) between the fast and slow delay paths 515 and 518. More particularly, each switch 525(1)-525(6) is coupled between a different pair of delay stage outputs of the fast and slow delay path 515 and 518. In the example shown in FIG. 5, each switch 525(1)-525(6) is a pass gate comprising an NMOS transistor and a p-type metal-oxide-semiconductor (PMOS) transistor coupled in parallel.

Each switch 525(1)-525(6) receives a respective select signal (denoted "s<1>" to "s<6>") and the inverse of the respective select signal (denoted "s<1>" to "s<6>") from the delay controller 560. For ease of illustration, the individual connections between the switches and the delay controller 560 are not shown in FIG. 5. In one aspect, each switch 525(1)-525(6) may be configured to couple the outputs of the respective delay stages when the respective select signal is logic one, and decouple the outputs of the respective delay stages when the respective select signal is logic zero. For example, when the first select signal s<1> is logic one, the first switch 525(1) is turned on, and couples the outputs of the first delay stages of the fast and slow delay paths 515 and 518. This is because the logic one of the first select signal s<1> turns on the NMOS transistor of the first switch 525(1) and the logic zero of the inverse of the first select signal $\overline{s<1>}$ turns on the PMOS transistor of the first switch 525(1). When the first select signal s<1> is logic zero, the first switch 525(1) is turned off. This is because the logic zero of the first select signal s<1> turns off the NMOS transistor of the first switch 525(1) and the logic one of the inverse of the first select signal $\overline{s<1>}$ turns off the PMOS transistor of the first switch 525(1).

The delay circuit 510 further comprises a multiplexer 550. The multiplexer 550 comprises a first input NAND gate 551, a second input NAND gate 554, and an output NAND gate 557. The first input NAND gate 551 has a first input 552 configured to receive a seventh select signal (denoted "s<7>") from the delay controller 560, and a second input 553 coupled to the output of the slow delay path 518. The second input NAND gate 554 has a first input 555 coupled to the output of the fast delay path 515, and a second input 556 configured to receive the inverse of the seventh select signal (denoted "$\overline{s<7>}$") from the delay controller 560. For ease of illustration, the individual connections between the delay controller 560 and the input NAND gates 551 and 554 are not shown in FIG. 5. The output NAND gate 557 has a first input 558 coupled to the output of the first input NAND gate 551, a second input 559 coupled to the output of the second input NAND gate 554, and an output coupled to the output (denoted "OUT") of the delay circuit 510.

The multiplexer 550 is configured to selectively couple the output of one of the fast and slow delay paths 515 and 518 to the output (OUT) of the delay circuit 510 according to the logic state of the seventh select signal s<7>. More particularly, the multiplexer 550 is configured to select the output of the slow delay path 518 when the seventh select signal s<7> is logic one. This is because the logic one of the seventh select signal s<7> causes the first input NAND gate 551 to function as an inverter, and the logic zero of the inverse of the seventh select signal $\overline{s<7>}$ causes the second input NAND gate 554 to output a logic one regardless on the logic state at the output of the fast delay path 515. As a result, the signal from the slow delay path 518 is allowed to propagate through the multiplexer 550 while the signal from the fast delay path 515 is blocked.

The multiplexer 550 is configured to select the output of the fast delay path 515 when the seventh select signal s<7> is logic zero. This is because the logic zero of the seventh select signal s<7> causes the first input NAND gate 551 to output a logic one regardless on the logic state at the output of the slow delay path 518, and the logic one of the inverse of the first select signal $\overline{s<7>}$ causes the second input NAND gate 554 to function as an inverter. As a result, the signal from the fast delay path 515 is allowed to propagate through the multiplexer 550 while the signal from the slow delay path 518 is blocked.

The delay controller 560 is configured to tune the delay of the delay circuit 510 by selecting which of the switches 525(1)-525(6) are turned on and which one of the delay paths 515 and 518 is coupled to the output (OUT) of the delay circuit 510 by the multiplexer 550. In the example shown in FIG. 5, the delay controller 560 can set the delay of the delay circuit 210 to any one of 13 different delay settings, although it is to be appreciated that embodiments of the present disclosure are not limited to this example.

In operation, the signal being delayed may be input to both the slow delay path 515 and the fast delay path 518. The delay controller 560 may set the delay of the delay circuit 510 to one of 13 different delay settings labeled "0" to "12", in which delay setting 0 is the fastest delay setting and delay setting 12 is the slowest delay setting.

For the fastest delay setting 0, the delay controller 560 turns off all of the switches 525(1)-525(6) and the selects the fast delay path 515. This setting results in the fastest (shortest) delay through the fast delay path 515.

For delay setting 1, the delay controller 560 turns on the first switch 525(1) with the other switches 525(2)-525(6) turned off, and selects the fast delay path 515. By turning on the first switch 525(1), the delay controller 560 couples the output of the first delay stage (i.e., NAND gate 520(1)) of the fast delay path 515 to the first capacitor C1 in the slow delay path 518. This increases the capacitive load at the first delay stage of the fast delay path 515, thereby increasing the delay of the first delay stage. The delay of the first stage of the fast delay path 515 may be increased to a delay that is approximately equal to an average of the delay of the first stage of the fast delay path 515 when the first switch 525(1) is turned off and the delay of the first stage of the slow delay path 518 when the first switch 525(1) is turned off. This is because the first capacitor C1 is driven by two NAND gates (i.e., NAND gates 520(1) and 530(1)) when the first switch 525(1) is turned on, whereas the first capacitor C1 is only driven by one NAND gate (i.e., NAND gate 530(1)) when the first switch 525(1) is turned off.

For delay settings 2 to 6, the delay controller 560 progressively turns on more of the switches 525(1)-525(6) from left to right in FIG. 5 with the fast delay path selected. More particularly, the delay controller 560 turns on switches 552(1) and 552(2) for delay setting 2, turns on switches 525(1)-525(3) for delay setting 3, turns on switches 525(1)-525(4) for delay setting 4, turns on switches 525(1)-525(5) for delay setting 5, and turns on all of the switches 525(1)-525(6) for delay setting 6. Delay setting 6 results in the slowest delay (longest delay) through the fast delay path 515. Thus, the delay through the fast delay path 515 progressively increases in moving from delay setting 0 to delay setting 6.

At delay setting 6, the delays through the fast delay path 515 and the slow delay path 518 may be approximately the same. Thus, the delay controller 560 may select either the fast delay path 515 or the slow delay path 518 for delay setting 6.

For delay setting 7, the delay controller 560 turns on switches 525(1)-525(5) with the sixth switch 525(6) turned off, and selects the slow delay path 518. By turning off the sixth switch 525(6), the delay controller 560 increases the delay of the sixth delay stage (i.e., NAND gate 530(6)) of the slow delay path 518 relative to the delay of the sixth delay stage of the slow delay path 518 at delay setting 6. This is because, at delay setting 6, the sixth delay stages (i.e., NAND gates 520(6) and 530(6)) of both the slow and fast delay paths 515 and 518 drive the sixth capacitor C6, whereas, at delay setting 7, only the sixth delay stage (i.e., NAND gate 530(6)) of the slow delay path 518 drives the sixth capacitor C6.

For delay settings 8 to 12, the delay controller 560 progressively turns off more of the switches 525(1) to 525(5) from right to left in FIG. 5 with the slow path selected. More particularly, the delay controller 560 turns off switches 525(5) and 525(6) for delay setting 8, turns off switches 525(4)-525(6) for delay setting 9, turns off switches 525(3)-525(6) for delay setting 10, turns off switches 525(2)-525(6) for delay setting 11, and turns off all of the switches 525(1)-525(6) for delay setting 12. Delay setting 12 results in the slowest delay (longest delay) through the slow delay path 518. This is because, at delay setting 12, each delay stage in the slow delay path 518 has to drive the respective capacitor C1-C6 without help from the respective delay stage in the fast delay path. Thus, the delay in the slow delay path progressively increases in moving from delay setting 7 to delay setting 12.

The table in FIG. 4 shows the switches that are turned on and the delay path that is selected by the delay controller 560 for each of the delay settings discussed above. FIG. 3 shows an example of delays (in picoseconds) for delay settings 0 to 12. The exemplary delays shown in FIG. 3 are for the exemplary implementation of the fine delay circuit shown in FIG. 5.

In one embodiment, the delay controller 560 may selectively disable and enable NAND gates in the delay circuit 510 depending on the current delay setting to conserve power. In this embodiment, the delay controller 560 may disable a particular NAND gate 520(1)-520(6) in the fast delay path 515 by inputting a logic zero to the first input 524(1)-524(6) of the NAND gate 520(1)-520(6), and enable a particular NAND gate 520(1)-520(6) in the fast delay path 515 by inputting a logic one to the first input 524(1)-524(6) of the NAND gate 520(1)-520(6). Similarly, the delay controller 560 may disable a particular NAND gate 530(1)-530(6) in the slow delay path 518 by inputting a logic zero to the first input 535(1)-535(6) of the NAND gate 530(1)-530(6), and enable a particular NAND gate 530(1)-530(6) in the slow delay path 518 by inputting a logic one to the first input 535(1)-535(6) of the NAND gate 530(1)-530(6). When a NAND gate is disabled, the output state of the NAND gate may remain fixed at one, thereby substantially reducing dynamic (switching) power associated with the NAND gate. When a NAND gate is enabled, the NAND gate functions as inverter, as discussed above.

In this embodiment, when a particularly delay setting is selected, the delay controller 560 may disable NAND gates in the delay circuit that are not needed for the delay setting to conserve power. For example, when delay setting 0 is selected, the delay controller 560 may disable all of the NAND gates 530(1)-530(6) in the slow delay path 518 to substantially reduce dynamic power consumption by these NAND gates. Similarly, when delay setting 12 is selected, the delay controller 560 may disable all of the NAND gates 520(1)-520(6) in the fast delay path 515.

For delay settings 1-5, the delay controller 560 may disable one or more NAND gate 530(2)-530(6) in the slow delay path 518 corresponding to switches that are turned off. In one aspect, if a NAND gate in the slow path 518 corresponds to a switch that is turned off, but is adjacent to a switch that is turned on, the delay controller 560 may leave the NAND gate enabled. This may be done to reduce changes in the loading effect the NAND gate has on the immediately preceding NAND gate in the slow delay path, where the immediately preceding NAND gate is enabled. In this aspect, the delay controller 560 may disable each NAND gate in the slow path 518 corresponding to a switch that is both turned off and not adjacent to a switch that is turned on, and may enable each NAND gate in the slow path 518 corresponding to a switch that is turned on. For example, if switches 525(2)-525(6) are turned off and switch 525(1) is turned on (delay setting 1), then the delay controller 560 may disable NAND gates 530 (3)-530(6) and enable NAND gates 530(1) and 530(2) in the slow path 518. In another example, if switches 525(3)-525(6) are turned off and switches 525(1) and 525(2) are turned on (delay setting 2), then the delay controller 560 may disable NAND gates 530(4)-530(6) and enable NAND gates 530(1)-530(3) in the slow path 518.

For delay settings 7-12, the delay controller 560 may disable one or more NAND gate 520(2)-520(6) in the fast path 515 corresponding to switches that are turned off. In one aspect, if a NAND gate in the fast path 515 corresponds to a switch that is turned off, but is adjacent to a switch that is turned on, the delay controller 560 may leave the NAND gate enabled. This is may be done to reduce changes in the loading effect the NAND gate has on the immediately preceding NAND gate in the fast delay path, where the immediately preceding NAND gate is enabled. In this aspect, the delay controller 560 may disable each NAND gate in the fast path 515 corresponding to a switch that is both turned off and not adjacent to a switch that is turned on, and may enable each NAND gate in the fast path 515 corresponding to a switch that is turned on. For example, if switches 525(5) and 525(6) are turned off and switches 525(1)-525(4) are turned on (delay setting 8), then the delay controller 560 may disable NAND gate 520(6) and enable NAND gates 520(1)-520(5) in the fast path 515. In another example, if switches 525(4)-525(6) are turned off and switches 525(1)-525(3) are turned on (delay setting 9), then the delay controller 560 may disable NAND gates 520(5) and 520(6) and enable NAND gates 520(1)-520(4) in the fast path 515.

In one embodiment, each NAND gate in the delay circuit 510 may be biased by one or more bias voltages that are dynamically adjusted to reduce variation in the delays of the NAND gates due to process-voltage-temperature (PVT) variation. In this embodiment, the one or more bias voltage may be generated by a delayed locked loop (DLL). The DLL may receive a reference clock (e.g., from a temperature-compensated crystal oscillator) that is approximately PVT invariant, and may adjust the one or more bias voltages based on the reference clock so that the delay of a NAND gate without capacitive loading from one of the capacitor C1 to C6 remains approximately constant over PVT variation.

In one embodiment, the fine delay circuit 210 or 510 may be used in combination with a coarse delay circuit. For example, the fine delay circuit 210 or 510 may be coupled in series with the coarse delay circuit. In this example, the coarse delay circuit may be used to provide coarse delay adjustments over a wide time range while the fine delay circuit may be used to provide fine delay adjustments.

As discussed above, the fine delay circuit 210 or 510 may be used in a memory interface to adjust the timing of signals (e.g., data signals) in the memory interface. For example, the fine delay circuit 210 or 510 (alone or in combination with a coarse delay circuit) may be used to delay a data signal to compensate for skew and/or align the center of a data eye of the data signal with an edge of a data strobe signal or clock signal used to sample the data signal.

Figure 6:
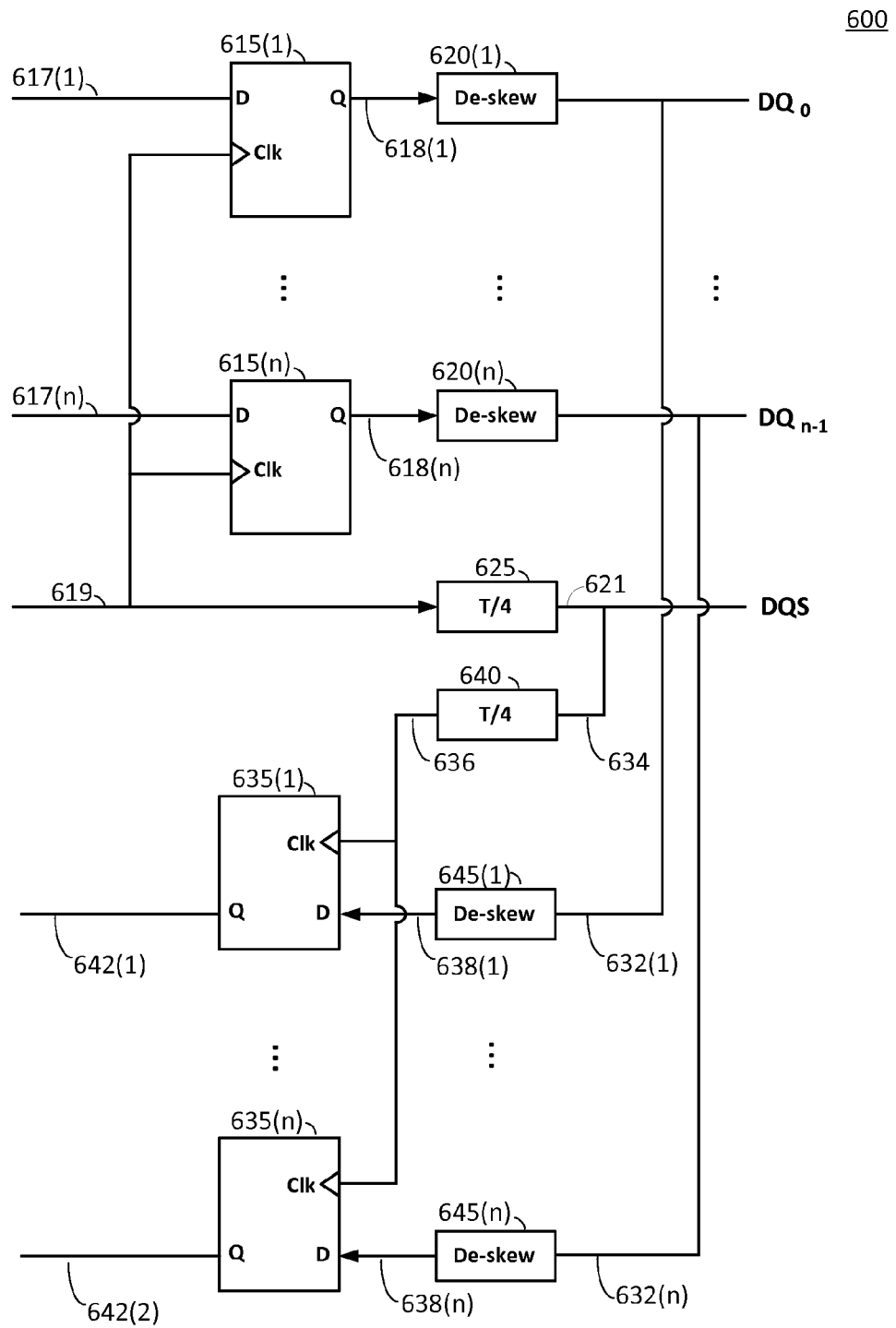
FIG. 6 shows an example of a memory interface for interfacing with an external memory device.

In this regard, FIG. 6 shows an exemplary memory interface 600 in which one or more fine delay circuit according to various embodiments of the present disclosure may be used. The memory interface 600 may be used to interface a memory controller (e.g., on a system on a chip (SoC)) with an external memory device (e.g., DDR DRAM). The memory interface 600 includes a first plurality of flip-flops 615(1)-615(n), a first plurality of de-skew circuits 620(1)-620(n), a second plurality of flip-flops 635(1)-635(n), a second plurality of de-skew circuits 645(1)-645(n), a first delay circuit 625, and a second delay circuit 640.

During write operations, the first plurality of flip-flops 615(1)-615(n) receive a plurality of data signals 617(1)-617 (n) in parallel. Each flip-flop 615(1)-615(n) also receives a data strobe signal 619, which may be a periodic signal having half the frequency of the incoming data signals 617(1)-617 (n). Each flip-flop 615(1)-615(n) captures data bits from the respective data signal 617(1)-617(n) on the rising and falling edges of the data strobe signal 619, and outputs the captured data bits to the respective de-skew circuit 620(1)-620(n), which is described in more detail below.

The data strobe signal 619 is also input to the first delay circuit 625. Before the first delay circuit 625, the edges of the data strobe signal 619 are approximately aligned with transitions of the output data signals 618(1)-618(n) of the flip-flops 615(1)-615(n). This is because each flip-flop 615(1)-615(n) captures data bits for the respective output data signal 618(1)-618(n) on the rising and falling edges of the data strobe signal 619. The first delay circuit 625 delays the data strobe signal 619 by a quarter of a period so that the edges of the delayed data strobe signal 621 are approximately centered between transitions of the output data signals 618(1)-618(n).

Each de-skew circuit 620(1)-620(n) adds controlled delay to the respective data signal 618(1)-618(n) to compensate for skew between the data signals in going from the memory interface 600 to the memory device (e.g., DDR DRAM). The skew may be due to mismatches in the lengths of the lines used to transport the data signals to the memory device and/or another cause. After being delayed by the respective de-skew circuit 620(1)-620(n), each output data signal is output to the memory device on a respective bi-directional data line $DQ_0$-$DQ_{n-1}$. The data strobe signal 621 is output to the memory device on a bi-directional strobe line DQS. The memory device uses the data strobe signal 621 to sample the data signals received from the memory interface 600.

During read operations, the memory interface 600 receives a plurality of data signals 632(1)-632(n) from the memory device via the bi-directional data lines $DQ_0$-$DQ_{n-1}$ and a data strobe signal 634 from the memory device via the bi-directional strobe line DQS. Each of the second plurality of de-skew circuits 645(1)-645(n) receives one of the data signals 632(1)-632(n) and adds controlled delay to the respective data signal to compensate for skew between the data signals.

The data strobe signal 634 from the memory device is input to the second delay circuit 640, which delays the data strobe signal 634 by a quarter of a period. This is done because the memory device outputs the data strobe signal 634 with the edges of the data strobe signal aligned with transitions of the data signals 632(1)-632(n). By delaying the data strobe signal 634 by a quarter of a period, the second delay circuit 640 approximately centers the edges of the delayed data strobe signal 636 between transitions of the data signals.

The delayed data strobe 636 is then input to the clock input of each of the second plurality of flip-flops 635(1)-635(n). For example, the delayed data strobe signal 636 may be distributed to the clock inputs of the flip-flops 635(1)-635(n) using a clock tree. Each flip-flop 635(1)-635(n) captures data bits from the output 638(1)-638(n) of the respective de-skew circuit 645(1)-645(n) on the rising and falling edges of delayed data strobe signal 636. The resulting output data signals 642(1)-642(n) may be sent to additional circuitry (not shown) in the memory interface 600 for further processing.

Each of the de-skew circuits 620(1)-620(n) and 645(1)-645(n) may comprise a fine delay circuit according to any of the embodiments discussed above. Further, each of the delay circuits 625 and 640 may comprise a fine delay circuit according to any of the embodiments discussed above. It is to be appreciated that embodiments of the present disclosure are not limited to use in memory interfaces, and may be used in other applications where fine delay control is desired.

Figure 7:
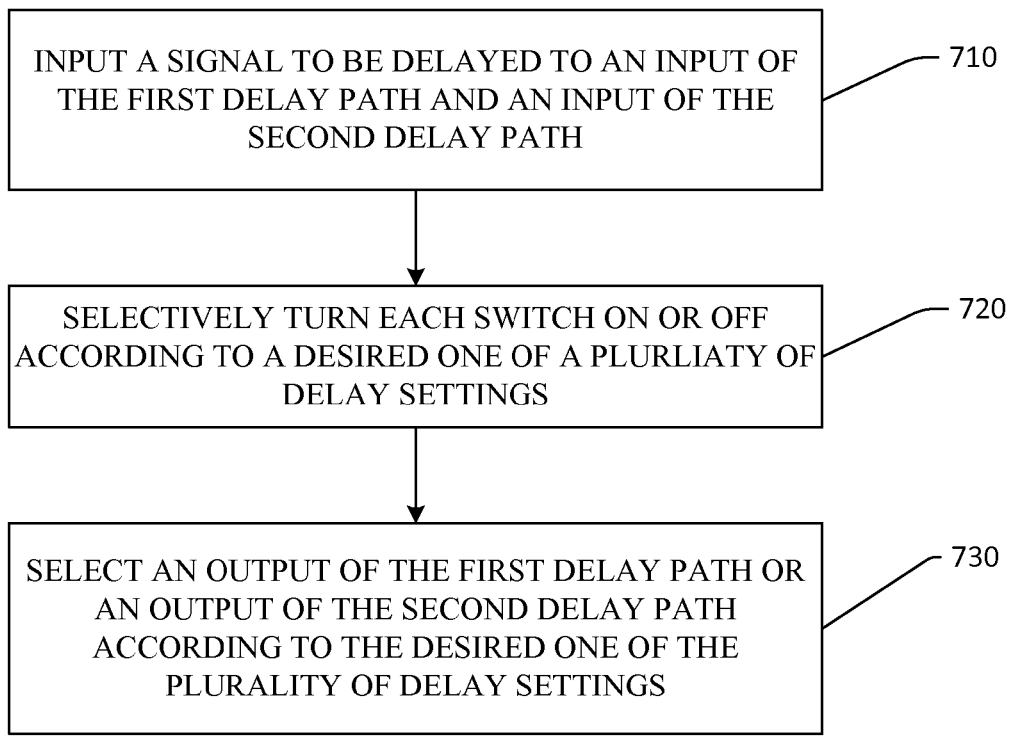
FIG. 7 is a flow diagram illustrating a method for controlling delay according to an embodiment of the present disclosure.

FIG. 7 is a flowchart illustrating a method 700 for controlling delay of a delay circuit according to an embodiment of the present disclosure. The delay circuit (e.g., delay circuit 210 or 510) comprises a first delay path (e.g., fast delay path 215 or 515), a second delay path (e.g., slow delay path 218 or 518), and a plurality of switches (e.g., switches 225(1)-225(6) or 525(1)-525(6)), wherein each of the plurality of switches is coupled between different points on the first and second delay paths.

In step 710, a signal to be delayed is input to an input of the first delay path and an input of the second delay path. For example, the signal may be input to an input (e.g., IN) of the delay circuit (e.g., 210 or 510) that is coupled to the input of the first delay path (e.g., fast delay path 215 or 515) and an input of the second delay path (e.g., slow delay path 218 or 518).

In step 720, each switch is selectively turned on or off according to a desired one of a plurality of delay settings. For example, each switch may be controlled by the logic state of a respective select signal (e.g., s<1> to s<6>), and each switch may be selectively turned on or off by controlling the logic state of the respective select signal.

In step 730, an output of the first delay path or an output of the second delay path is selected according to the desired one of the plurality of delay settings. For example, the outputs of the first and second delay paths may be coupled to a multiplexer (e.g., multiplexer 250 or 550), and the multiplexer may be used to selectively couple the out of the first delay path or the output of the second delay path to an output (e.g., OUT) of the delay circuit.

It is to be appreciated that the delay controller according to any of the embodiments discussed above may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may perform the functions of the delay controller described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A delay circuit, comprising:
   a first delay path having an input coupled to an input of the delay circuit, and an output wherein the first delay path comprises a first plurality of delay gates coupled in series;
   a second delay path having an input coupled to the input of the delay circuit, and an output, wherein the second delay path comprises a second plurality of delay gates coupled in series;
   a plurality of switches, wherein each switch is coupled between an output of a different one of the first plurality of delay gates and an output of a different one of the second plurality of delay gates, and each switch is configured to turn on or off in response to a respective one of a plurality of select signals; and
   a multiplexer having a first input coupled to the output of the first delay path, a second input coupled to the output of the second delay path, and an output coupled to an output of the delay circuit, wherein the multiplexer is configured to selectively couple one of the outputs of the first and second delay paths to the output of the delay circuit in response to a second select signal.

2. The delay circuit of claim 1, wherein each of the first plurality of delay gates comprises a NAND gate.

3. The delay circuit of claim 2, wherein each NAND has a first input coupled to a supply voltage and a second input coupled to a signal path of a signal being delayed by the first delay path.

4. The delay circuit of claim 1, wherein each of the first plurality of delay gates comprises an inverter.

5. The delay circuit of claim 1, wherein the first delay path comprises a plurality of capacitors, and each of the capacitors is coupled to the output of a different one of the first plurality of delay gates.

6. The delay circuit of claim 1, further comprising a delay controller, wherein the delay controller is configured to control the plurality of switches using the plurality of select signals and to control the multiplexer using the second select signal, and to set the delay circuit to one of a plurality of different delay settings, each delay setting corresponding to a different combination of values for the plurality of select signals and the second select signal.

7. The delay circuit of claim 6, wherein a first one of the delay settings corresponds to one of the plurality of switches turned on with first remaining ones of the plurality of switches turned off, and selection of the first delay path by the multiplexer.

8. The delay circuit of claim 7, wherein a second one of the delay settings corresponds to two of the plurality of switches turned on with second remaining ones of the plurality of switches turned off, and the selection of the first delay path by the multiplexer.

9. The delay circuit of claim 8, wherein a third one of the delay settings corresponds to three of the plurality of switches turned on with third remaining ones of the plurality of switches turned off, and the selection of the first delay path by the multiplexer.

10. The delay circuit of claim 7, wherein a second one of the delay settings corresponds to all of the plurality of switches turned on, and the selection of the first delay path by the multiplexer.

11. The delay circuit of claim 7, wherein a second one of the delay settings corresponds to the one of the plurality of switches turned on with the first remaining ones of the plurality of switches turned off, and selection of the second delay path by the multiplexer.

12. The delay circuit of claim 11, wherein a third one of the delay settings corresponds to two of the plurality of switches turned on with second remaining ones of the plurality of switches turned off, and the selection of the second delay path by the multiplexer.

13. A method for controlling delay of a delay circuit, the delay circuit comprising first and second delay paths and a plurality of switches, wherein the first delay path comprises a first plurality of delay gates coupled in series, the second delay path comprises a second plurality of delay gates coupled in series, and each of the plurality of switches is coupled between an output of a different one of the first plurality of delay gates and an output of a different one of the second plurality of delay gates, the method comprising:
inputting a signal to be delayed to an input of the first delay path and an input of the second delay path;
selectively turning each switch on or off according to a desired one of a plurality of delay settings; and
selecting an output of the first delay path or an output of the second delay path according to the desired one of the plurality of delay settings.

14. The method of claim 13, wherein each of the first plurality of delay gates comprises a NAND gate.

15. The method of claim 13, wherein each of the first plurality of delay gates comprises an inverter.

16. The method of claim 13, wherein a first one of the delay settings corresponds to one of the plurality of switches turned on with first remaining ones of the plurality of switches turned off, and selection of the output of the first delay path.

17. The method of claim 16, wherein a second one of the delay settings corresponds to two of the plurality of switches turned on with second remaining ones of the plurality of switches turned off, and the selection of the output of the first delay path.

18. The method of claim 16, wherein a second one of the delay settings corresponds to all of the plurality of switches turned on, and the selection of the output of the first delay path.

19. The method of claim 16, wherein a second one of the delay settings corresponds to the one of the plurality of switches turned on with the first remaining ones of the plurality of switches turned off, and selection of the output of the second delay path.

20. The method of claim 19, wherein a third one of the delay settings corresponds to two of the plurality of switches turned on with second remaining ones of the plurality of switches turned off, and the selection of the output of the second delay path.

21. The method of claim 13, further comprising selecting the desired one of the plurality of the delay settings based on a skew between the signal being delayed and another signal.

22. An apparatus for controlling delay of a delay circuit, the delay circuit comprising first and second delay paths and a plurality of switches, wherein the first delay path comprises a first plurality of delay gates coupled in series, the second delay path comprises a second plurality of delay gates coupled in series, and each of the plurality of switches is coupled between an output of a different one of the first plurality of delay gates and an output of a different one of the second plurality of delay gates, the apparatus comprising:
means for inputting a signal to be delayed to an input of the first delay path and an input of the second delay path;
means for selectively turning each switch on or off according to a desired one of a plurality of delay settings; and
means for selecting an output of the first delay path or an output of the second delay path according to the desired one of the plurality of delay settings.

23. The apparatus of claim 22, wherein a first one of the delay settings corresponds to one of the plurality of switches turned on with first remaining ones of the plurality of switches turned off, and selection of the output of the first delay path.

24. The apparatus of claim 23, wherein a second one of the delay settings corresponds to two of the plurality of switches turned on with second remaining ones of the plurality of switches turned off, and the selection of the output of the first delay path.

25. The apparatus of claim 23, wherein a second one of the delay settings corresponds to all of the plurality of switches turned on, and the selection of the output of the first delay path.

26. The apparatus of claim 23, wherein a second one of the delay settings corresponds to the one of the plurality of switches turned on with the first remaining ones of the plurality of switches turned off, and selection of the output of the second delay path.

27. The apparatus of claim 26, wherein a third one of the delay settings corresponds to two of the plurality of switches turned on with second remaining ones of the plurality of switches turned off, and the selection of the output of the second delay path.

28. The apparatus of claim 23, further comprising means for selecting the desired one of the plurality of the delay settings based on a skew between the signal being delayed and another signal.

* * * * *